US009454283B1

(12) United States Patent
Torgerson et al.

(10) Patent No.: US 9,454,283 B1
(45) Date of Patent: Sep. 27, 2016

(54) THREE-DIMENSIONAL VISUALIZATION

(75) Inventors: Jay Ryan Torgerson, Hopkinton, MA (US); Simon Greenwold, Newton Highlands, MA (US); Claudia Wey, Wayland, MA (US); Eric Pressman, Needham, MA (US); Matthew Englehart, Olmsted Township, OH (US)

(73) Assignee: The Mathworks, Inc., Natick, MA (US)

(*) Notice: Subject to any disclaimer, the term of this patent is extended or adjusted under 35 U.S.C. 154(b) by 1659 days.

(21) Appl. No.: 12/137,130

(22) Filed: Jun. 11, 2008

Related U.S. Application Data

(60) Provisional application No. 61/019,384, filed on Jan. 7, 2008.

(51) Int. Cl.
*G06F 3/0481* (2013.01)

(52) U.S. Cl.
CPC ....... *G06F 3/04815* (2013.01); *G06F 3/04817* (2013.01)

(58) Field of Classification Search
CPC .......... G06F 3/04815; G06F 3/04817; G06F 3/0482; G06T 19/003
USPC ................. 715/782, 848–852, 853–855, 708
See application file for complete search history.

(56) References Cited

U.S. PATENT DOCUMENTS

| | | | |
|---|---|---|---|
| 5,801,707 A * | 9/1998 | Rolnik et al. | 715/853 |
| 5,864,343 A * | 1/1999 | Naughton | G06T 15/10 345/419 |
| 6,240,418 B1 * | 5/2001 | Shadmon | 707/696 |
| 6,297,824 B1 * | 10/2001 | Hearst et al. | 715/848 |
| 6,333,918 B1 * | 12/2001 | Hummel | 370/238 |
| 6,396,522 B1 * | 5/2002 | Vu | 715/848 |
| 6,995,768 B2 * | 2/2006 | Jou et al. | 345/440 |
| 7,512,531 B1 * | 3/2009 | Shia | 703/16 |
| 2002/0030703 A1 * | 3/2002 | Robertson | G06F 17/30961 715/853 |
| 2002/0186217 A1 * | 12/2002 | Kamata et al. | 345/427 |
| 2003/0067496 A1 * | 4/2003 | Tasker | G05B 19/40933 715/846 |
| 2003/0081012 A1 * | 5/2003 | Chang | 345/848 |
| 2003/0100964 A1 * | 5/2003 | Kluge et al. | 700/83 |
| 2003/0117405 A1 * | 6/2003 | Hubrecht et al. | 345/543 |
| 2004/0090463 A1 * | 5/2004 | Celik | G06F 3/0481 715/767 |
| 2005/0010580 A1 * | 1/2005 | Lancefield | 707/100 |
| 2006/0061571 A1 * | 3/2006 | Nomura et al. | 345/427 |
| 2006/0122845 A1 * | 6/2006 | Denford et al. | 705/1 |
| 2007/0146389 A1 * | 6/2007 | Distler | 345/629 |
| 2007/0150330 A1 * | 6/2007 | McGoveran | 705/8 |
| 2007/0268536 A1 * | 11/2007 | Holmes et al. | 359/2 |
| 2008/0189227 A1 * | 8/2008 | Kandregula et al. | 706/10 |

OTHER PUBLICATIONS

BumpTop 3D Desktop Prototype—www.bumptop.com, retrieved online at http://www.youtube.com/watch?v=M0ODskdEPnQ (2006).

* cited by examiner

*Primary Examiner* — Steven Sax
(74) *Attorney, Agent, or Firm* — Pierce Atwood LLP; Kevin M. Farrell; Reza Sadr

(57) ABSTRACT

In an embodiment, a mechanism for visualizing a graphical model in three dimensions is discussed. An executable graphical model is obtained that includes a hierarchy of model levels that include a top level. The hierarchy includes multiple components. A three-dimensional (3D) view of the graphical model is displayed that provides views of a first and second component at a first and second depth. A graphical indicator is generated in the view of the top level of the graphical model that is associated with the first component and also generated in the view of the second component. A control alters a user perspective of a view that includes at least one of the components in the graphical model.

31 Claims, 16 Drawing Sheets

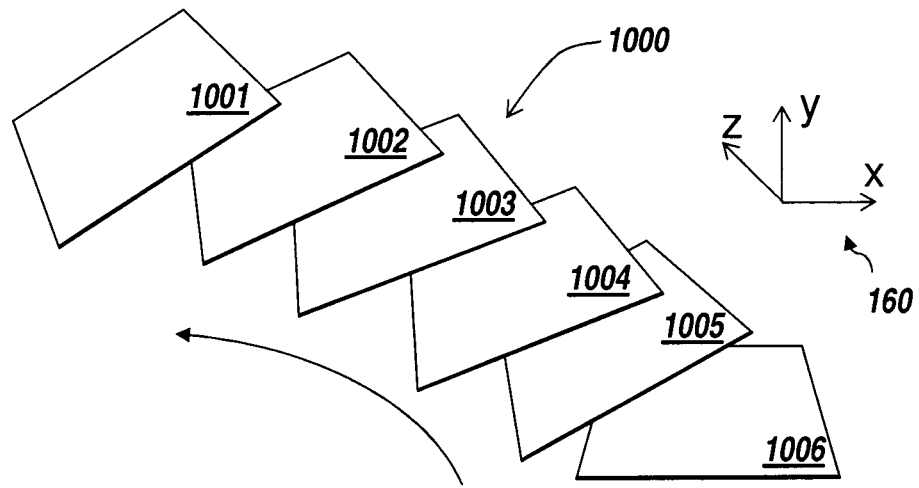
Fig. 10A
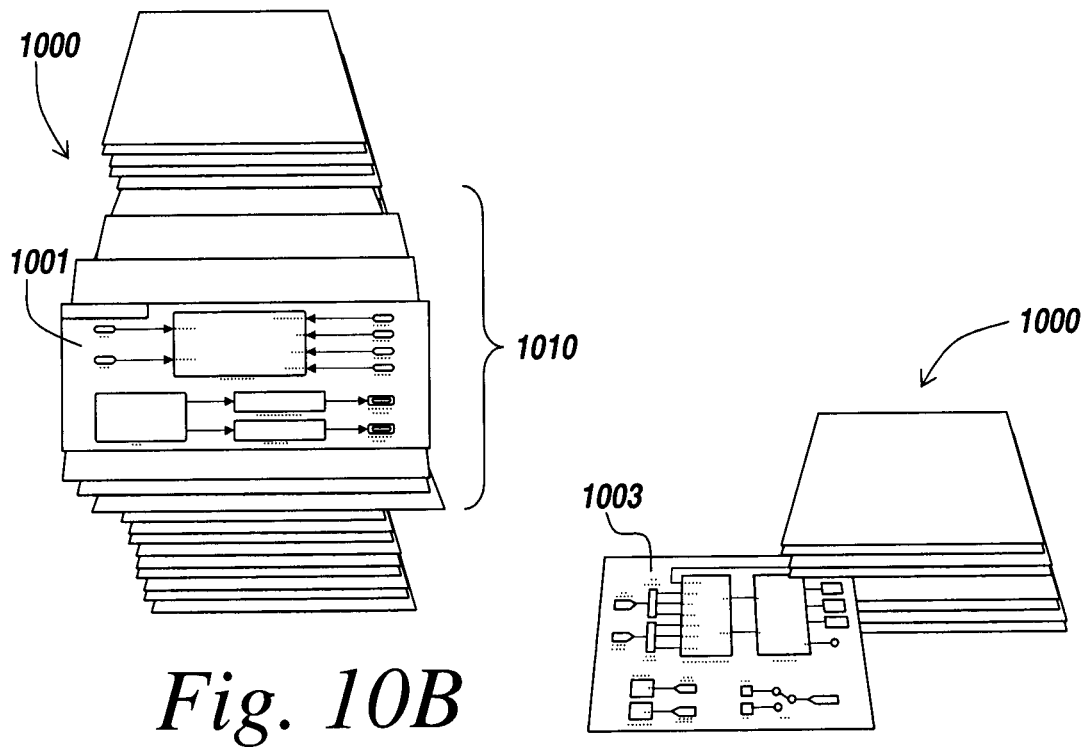
Fig. 10B
Fig. 10C ary distributed system suitable# THREE-DIMENSIONAL VISUALIZATION

RELATED APPLICATION

The present application claims the benefit of a United States Provisional Patent application entitled "Three Dimensional Visualization", Application No. 61/019,384, filed on Jan. 7, 2008, the contents of which are incorporated by reference in their entirety.

BACKGROUND INFORMATION

Graphical modeling environments may allow a user to develop, analyze, and simulate graphical computer models of real-world systems. A graphical model may include a number of different components and may include a hierarchical structure that includes multiple levels. For example, a top level of the graphical model may include a number of components. One or more of the components in the top level may be a component that references a subsystem. The subsystem may also include multiple components, at least one of which may also reference another subsystem.

BRIEF DESCRIPTION OF THE DRAWINGS

The accompanying drawings, which are incorporated in and constitute a part of this specification, illustrate one or more embodiments of the invention and, together with the description, explain the invention. In the drawings:

FIGS. 10A-C depict exemplary manipulations of the stack created in FIG. 9;

DETAILED DESCRIPTION

Overview

Figure 1A:
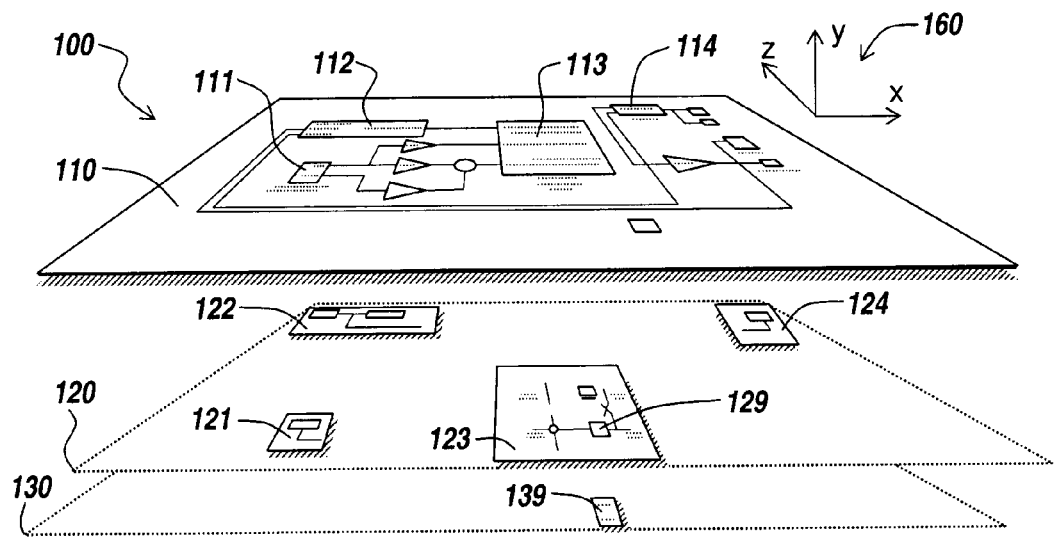
FIGS. 1A and 1B depict exemplary graphical hierarchical relationships in a model that may be illustrated in three dimensions.

Exemplary embodiments render graphical models in a graphical modeling environment so as to provide a visual effect of a third dimension to a user observing the graphical model. The three-dimensional (3D) view or "perspective view" may be used to illustrate relationships between components located at different hierarchical levels in a graphical model. The hierarchical relationships may be depicted using one or more separate planes or levels of hierarchy. These separate planes may assist the user in visualizing the hierarchy. For example, the perspective view may be used to depict a relationship between a subsystem block (representative of a subsystem) in a top level of a block diagram and a separate level containing a graphical representation of the subsystem referenced by the subsystem block. Exemplary hierarchies may include a structural hierarchy, a functional hierarchy, a dependency hierarchy, etc. A graphical indicator, such as color coding or shaded projections, may be provided that identifies an association between elements on different levels of the hierarchy so that the user can understand the association between elements. A control may also be provided in the viewing area that allows a user to alter the perspective view.

Perspective views used in exemplary embodiments may also convey information to a user via different orientations of the model components. For example, a "fish eye" focus may be presented that magnifies items of importance to make them appear closer to a user while de-emphasizing items of lesser importance by shrinking them so as to appear farther away from the user. Additionally, a user may specify a tilting ratio that uses the orientation to reflect the state of the model or graphical object (e.g., to reflect that a graphical object is being edited). The tilting ratio may also be used to provide perspective by emphasizing/de-emphasizing certain elements in a perspective view presented to a user (e.g., by tilting certain graphical objects towards a user so that their content is exposed to the user while tilting other graphical objects away from the user to hide content).

Graphical objects depicted in a perspective view by the exemplary embodiments may represent graphical models and graphical model components such as blocks, subsystem blocks, scope components, hierarchical states in a state diagram model, etc. A graphical object may further represent algorithmic aspects of a model such as sum, product, lookup tables, queue, server, etc. A graphical object may also represent a textual specification in, for example, a programming language such as C or in embedded MATLAB. Graphical objects may represent, but are not limited to continuous and/or discrete dynamic elements, such as integration elements, unit delay elements, etc. and/or structural elements, such as multiplexers, switches, signal or bus selectors, etc. Graphical objects may also represent states in a state diagram model.

Exemplary embodiments may also allow a user to navigate "through" the perspective view "towards" graphical objects by providing the user with the visual effect of traveling into the display (i.e., in a third dimension). A user may choose to observe the graphical object from a perspective that is above, below or from the sides of the graphical object. "Focus dots" or other controls may be provided to enable a user to navigate to particular locations and magnify specified areas of the perspective view.

Exemplary 3D Views of Hierarchical Systems

Previous modeling environments for graphical models have displayed the graphical models so as to present a two-dimensional perspective of the graphical model to a user. For example, a block diagram model may have included one or more levels and those levels may have been displayed individually to the user via a two-dimensional perspective. When a level was displayed that included a component representing a subsystem, tools were provided to allow the user to select the subsystem component in order to identify further information about the subsystem. Upon selecting this subsystem component a separate representation of the subsystem was displayed in a viewing area. The representation of the subsystem may have been displayed in addition to the display of the original level, or may have been displayed in place of the original level. As a result, a user either viewed the subsystem representation in isolation from the level from which it was referenced or viewed the representation in a cluttered viewing area.

Another previous two-dimensional perspective frequently utilized in modeling environments is the presentation of information via a 'tree' view. Individual elements of the tree view could be selected by the user to obtain more information about the selected element. Upon selection, information about the selected element was displayed to a user. This selection mechanism also resulted in the user viewing information in an isolated manner. These previous two-dimensional mechanisms for viewing hierarchical information may not have provided a customizable indication of the relationship between model components that allowed multiple levels of hierarchy of the graphical model to be simultaneously viewed without cluttering the viewing area.

Figure 1B:
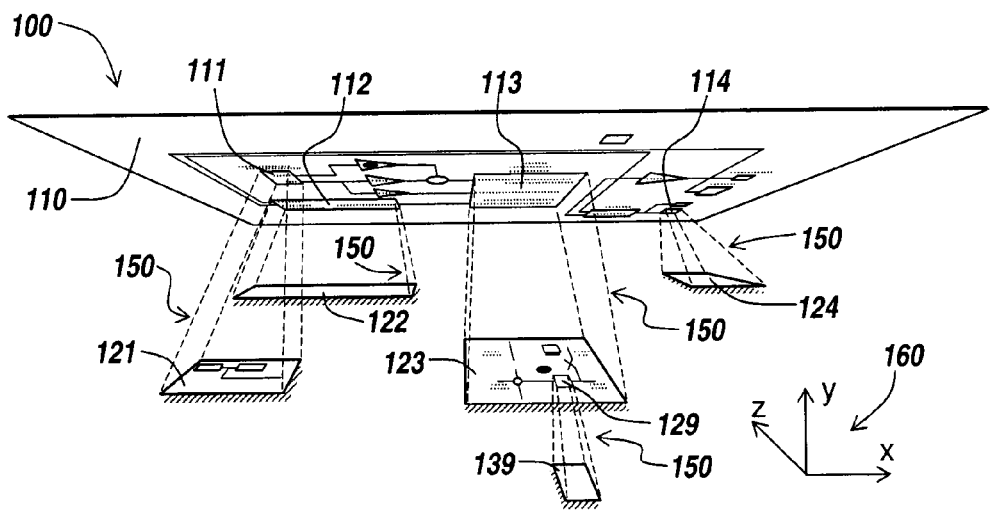

In contrast to two-dimensional viewing mechanisms, perspective views utilized by embodiments described herein may allow a user to view a hierarchical relationship associated with a graphical model, or portion thereof, using three-dimensional views. FIGS. 1A and 1B depict exemplary graphical hierarchical relationships in a model that may be illustrated in three dimensions. For example, FIG. 1A depicts a 3D perspective view 100 that may be used to represent a hierarchical relationship among graphical objects in a graphical model. In this example, the perspective view 100 depicts three levels, top level 110, second level 120 and third level 130 of the graphical model hierarchy. Top level 110, second level 120 and third level 130 may be individually depicted on visible planes to help a user distinguish which graphical objects are on each level. The planes may be depicted as solid planes or translucent planes. In some embodiments, the planes may not be visible. In the case of non-visible planes, components on the same level are arranged at the same visual depth and the user may visually observe the levels of the graphical model without a plane providing a visual connection between components in that level.

In perspective view 100, top level 110 may include a number of model components. Some of these model components, such as subsystem components 111-114 represent subsystems. Subsystems referenced by a subsystem component may be shown on a separate level of model hierarchy. For example, subsystem components 111-114 may respectively reference subsystems 121-124 that may be shown as graphical objects on a second level 120 in perspective view 100.

In one embodiment, second level 120 may be represented by a visible plane in perspective view 100 upon which the graphical objects representing the subsystems are displayed. Alternatively, the plane may be a non-visible plane in which the graphical objects representing subsystems 121-124 may be represented on the second level 120 at a common visual depth but without a unifying plane. It will be appreciated that a graphical model may have an unlimited number of levels. Thus subsystem 123 may include its own subsystem component 129. Perspective view 100 may show a third level 130 of the graphical model that includes a graphical object representing subsystem 139 that is referenced by subsystem component 129 on second level 120. Graphical objects displayed on third level 130 of the graphical model may or may not be connected by a visible plane.

In one embodiment, model components 111-114 may represent a configurable subsystem or a superblock. A configurable subsystem block represents one of a set of blocks contained in a specified library of blocks. The block's context menu allows a user to choose which block the configurable subsystem represents. Configurable Subsystem blocks simplify creation of models that represent families of designs. A superblock is a hierarchical construct whose timing properties define those of the functional blocks it contains. Superblocks allow the implementation of stand-alone procedures; their timing is inherited from a parent block or they may run asynchronously.

Hierarchical relationships or associations between graphical objects in a graphical model that are being displayed in a perspective view may be emphasized in a number of different ways. In some embodiments, a given level of the graphical model may have a common base color to aid the user in determining which graphical objects belong to which level of the graphical model. Thus, in the top level of a graphical model, all of the components except for components representing a subsystem may be a first color. A unifying visible plane if present may also be the same first color. Subsystem components in the top level may be depicted in a different color that is the same as a color assigned to the level of their respective subsystem.

For example, in FIG. 1A, non-subsystem graphical objects that are depicted in top level 110, as well as the visible plane, may be depicted in blue. The graphical objects representing subsystem components 111-114 may be represented in yellow to match a yellow color associated with second level 120 where subsystems 121-124 are depicted. Similarly, graphical object 129 representing a subsystem component in subsystem 123 may be depicted in red to match a coloring scheme assigned to third level 130 where subsystem 139 is depicted.

In another embodiment, graphical objects may have an indicator assigned that uniquely associates referencing and referenced objects in a vertical hierarchy (e.g., a subsystem component on a first level that references a subsystem representation on a second level). Thus, graphical objects 111 and 121 may be assigned a first color while graphical objects 113, 123 and 139 are all assigned a second color. A user of the perspective view 100 would therefore be able to quickly tell that the subsystem component 111 referenced subsystem 121, while subsystem component 113 referenced a subsystem 123 which included its own subsystem 139. Embodiments may use techniques other than color to show hierarchical relationships between graphical objects in a model without departing from the scope of the invention. For example, shading, patterns, variations in font size, line thickness, etc. may also be used.

FIG. 1B illustrates an exemplary embodiment that can assist a user in determining graphical hierarchical relationships that exist in the graphical model. In FIG. 1B, lines 150 extend between associated graphical objects representing model components on the different levels (top level 110, second level 120 and third level 130). Lines 150 may be used to show hierarchical relationships such as a subsystem component 111 in top level 110 and associated subsystem 121 in second level 120. In one embodiment, the lines may be replaced by shaded beams or other techniques extending from one model component on one level to another model component on a different level. It should be noted that top level 110 uses a visible plane to connect the components on top level 110 while second level 120 and third level 130 use a non-visible plane. In second level 120 for example, graphical objects 121, 122, 123 and 124 are depicted at a common visual depth without a unifying plane, The perspective view 100 may also include controls that allow a user to change perspectives from which a graphical model is viewed. Thus, in contrast to FIG. 1A which depicted top level 110 of the graphical model 100 from above, the perspective of FIG. 1B is from the bottom of top level 110. The controls may also allow a user may select individual graphical objects and cause them to rotate on an axis so that the associated content becomes less or more or less visible to the user. For example, by rotating a graphical object representing a subsystem so that it appears to face the viewer, the subsystem contents become more discernible. In contrast, a user may use a control to rotate a graphical object in which the user is not interested so that it appears horizontally opposed to the user so that the content vanishes from view (e.g., like the writing on a piece of paper held flat at eye level in front of a person at arms length disappears). In one embodiment, changes to the viewing perspective may also occur automatically based upon user interaction with the modeling environment. For example, the viewing perspective may automatically change based upon a user selection of a model component.

In some embodiments, the user may collapse the hierarchical levels (top level 110, second level 120 and third level 130) so that only level 110 is visible. The user may specify a number of levels to be rendered and may also specify which levels in the hierarchy are rendered when the hierarchical levels (e.g., top level 110, second level 120 and third level 130) are expanded.

Figure 1C:
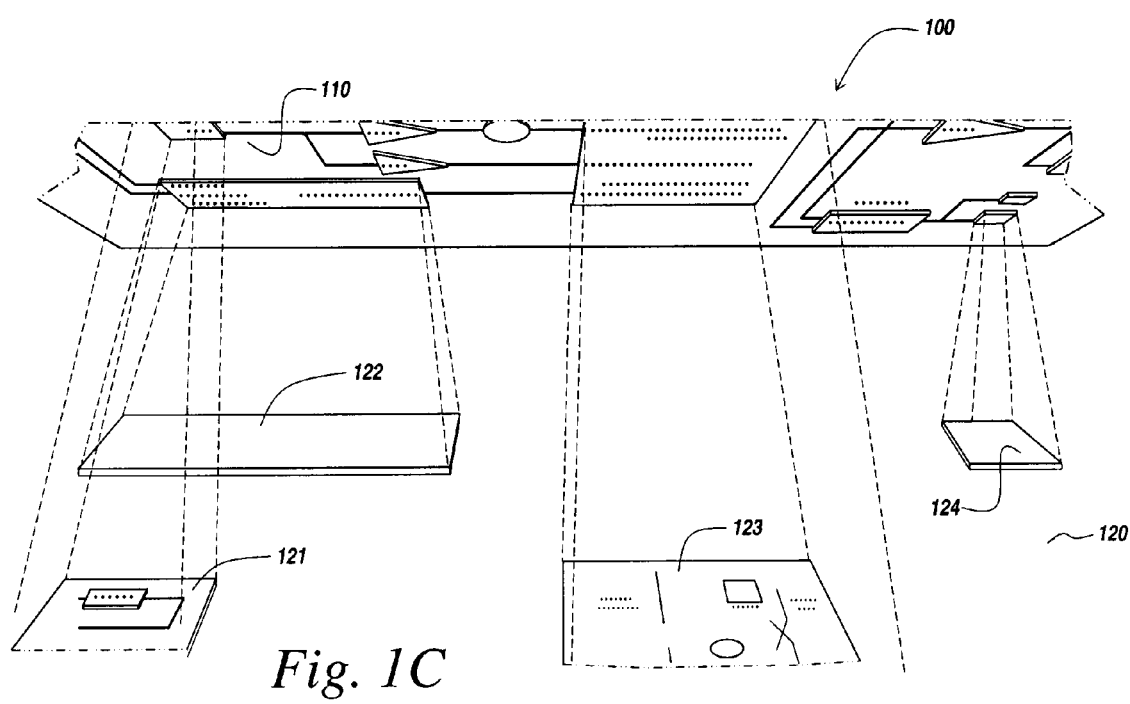
FIGS. 1C and 1D depict exemplary navigation along the z-axis of the illustrated model of FIG. 1B.
Figure 1D:
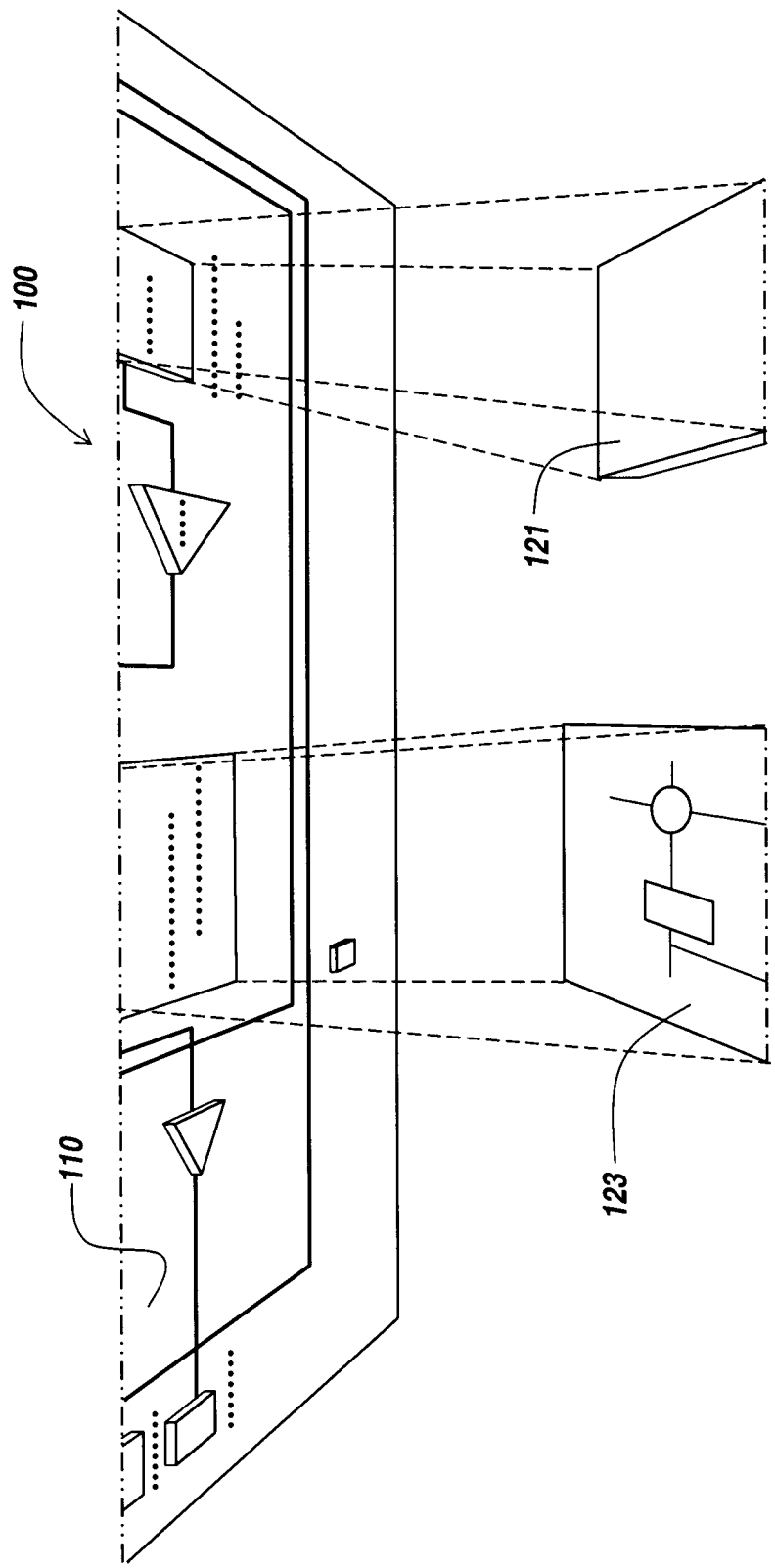

In one embodiment, the perspective view provides the ability to navigate along the z-axis so as to give a user the impression of traveling into the depicted model hierarchy. For example, FIGS. 1C and 1D depict exemplary navigation along the z-axis of the illustrated model of FIG. 1B. By traveling along the z-axis, the depicted model hierarchy may appear to grow to fill the screen with parts of the model hierarchy growing in size while other parts that are located away from the center of focus leave the screen. FIG. 1C depicts an exemplary traversal along the z-axis into the graphical model 100. The perspective view changes as a user travels along the z-axis so that the user appears to be traveling into the graphical model 100 between top level 110 and second level 120. Top level 110 as well as graphical objects 121, 122, 123 and 124 (that are located on second level 120) may all appear to enlarge. Additionally graphical objects 121 and 123 may only be partially depicted on the edge of the display area so as to give the impression that the user is traveling to the center of the perspective view and has "gone past" a portion of those objects.

The perspective view may also allow a backward view. In one embodiment a dual-head monitor may be employed in which a front view may be depicted on one monitor while a backward view is depicted on a second monitor to enhance the impression for a user of traveling into the model hierarchy. For example, FIG. 1D depicts a backward looking view of the graphical model 100 following the exemplary traversal along the z-axis that was depicted in FIG. 1C. In FIG. 1D, the portions of graphical objects 121 and 123 that were "passed" during the traversal along the z-axis may be seen. It should be that noted that graphical objects 122 and 124 which were shown in FIG. 1C are absent from the backward looking view as those objects were entirely "in front" of the user in FIG. 1C.

Figure 2:
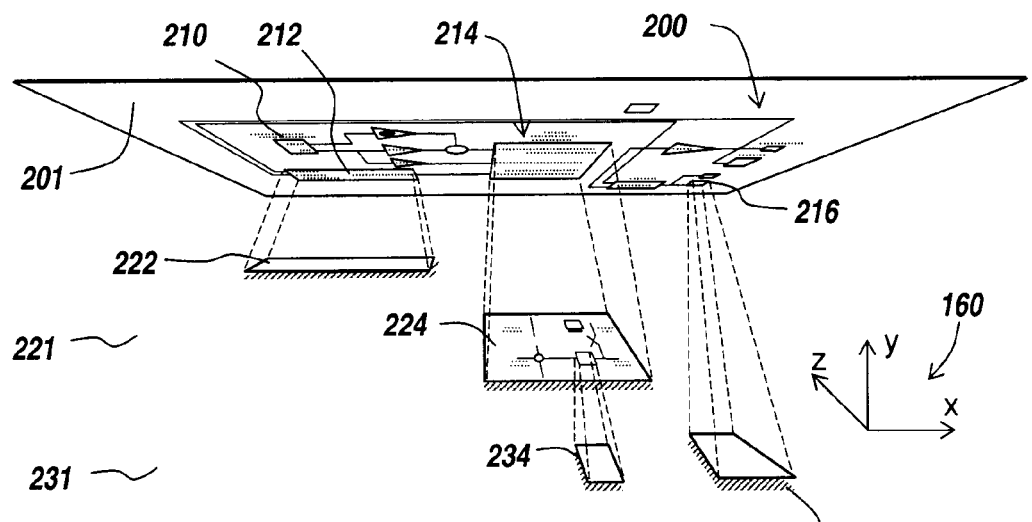
FIG. 2 depicts an exemplary functional hierarchical relationship that may be illustrated in three dimensions in a graphical model.

FIG. 2 illustrates another type of relationship that may be depicted using a perspective view. The relationships depicted in FIG. 2 represent a hierarchy based on functional relationships in the graphical model 200. The perspective view may be used to indicate how elements in a graphical model 200 are associated with the functional elements that they reference. For example, the functional relationships in a graphical model for virtual subsystems and/or function call subsystems embedded in other subsystems may be shown.

A functional hierarchy may not differ from a graphical hierarchy. In FIG. 2, the perspective view displays a top level 201 of a functional hierarchy. The model elements of top level 201 include subsystems 210, 212, 214 and 216. The perspective view may depict graphical object 222 that relates to a functional relationship of the subsystem 212. In this example, graphical object 222 is positioned in second level 221 of the hierarchy (the level below the top level 201) to indicate that the functional aspects of the graphical object 222 are one level below the top level. For example, graphical object 222 may represent the contents of subsystem block 212. In this case, the depiction of the functional relationship is one level below the top level 201. This is similar to the graphical relationships for subsystems depicted in FIGS. 1A and 1B in which the subsystems were also depicted one level below the top level. Similarly, graphical object 224 may represent the contents of subsystem block 214, and graphical object 234 may represent functionality for a subsystem block found in graphical object 224.

In another embodiment, a functional hierarchy may also differ from the graphical hierarchy. The perspective view may display graphical object 236 that relates to a functional aspect of subsystem 216. Graphical object 236 may be positioned in third level 231 of the hierarchy to indicate that the functional aspect of subsystem 216 is two levels below the top level 201. For example, subsystem 216 may be a function-call subsystem (a triggered subsystem whose execution is determined by logic internal to a function block rather than a signal) whose function call initiator (the functional aspect) is inside another non-inlined subsystem block. Graphical object 236 in such a case would be displayed two levels removed from the top level (the intervening subsystem block at second level 221 that includes the function call initiator would not be shown). Similarly, subsystem block 210 may represent a virtual subsystem block. In such an instance, a virtual subsystem may not be rendered below the top level 201 in a display of functional hierarchy since the virtual subsystem will not actually be executed by the model.

In one embodiment, a type of hierarchical relationship that may be represented using perspective views may be an hStruct (hierarchical structure) hierarchy. An hStruct hierarchy may be used to depict a hierarchical partitioning of global data within a model.

In some embodiments, a 3D perspective view may be displayed in a modeling environment that allows a user to experience the perception of navigating amongst the displayed model content. The user may choose to navigate to a location that appears to be at a certain depth in the display and view the content from different angles.

Figure 3:
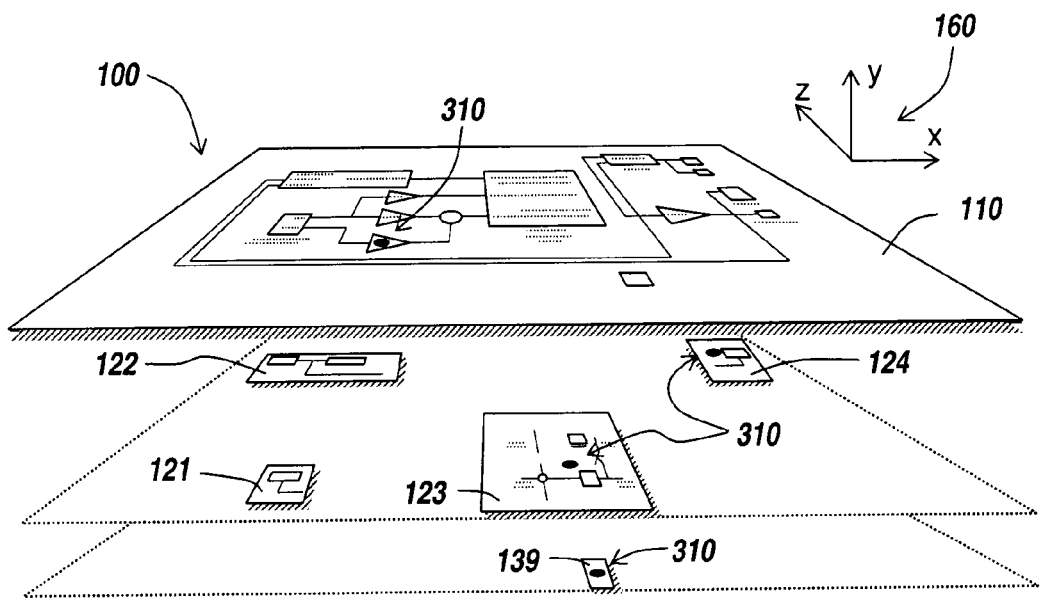
FIG. 3 depicts an exemplary embodiment with a selectable focus tool that may be used to change a three-dimensional viewing perspective.

FIG. 3 depicts an exemplary embodiment with a selectable focus tool that may be used to change a three-dimensional viewing perspective. The embodiment of FIG. 3 may use focus dots 310 to assist the user in navigating to various locations in the model 100. For example, focus dots 310 may be displayed on graphical objects 123, 124 and 139 in FIG. 3. In FIG. 3, the user may navigate to a location by selecting one of focus dots 310. The user may select one of focus dots 310 by, for example, positioning a pointing device over one of focus dots 310. When the user selects one of focus dots 310, the location corresponding to the selected one of the focus dots 310 may shift in the display so that the location appears to be closer to the user than it was prior to the selection.

In one embodiment, a graphical modeling environment may assign meanings to various movements or buttons on a pointing device to allow the user to navigate in a three-dimensional space based on, for example, coordinates, such as coordinates associated with an x, y, z axis 160. For example, by clicking a left mouse button the user may navigate into the display along the z-axis, while clicking the right mouse button may result in the navigating out of the display (i.e. towards the user). In some embodiments, an input device using motion sensors may be provided that allows the user to move the device in a 3D space with the three-dimensional movement of the device being translated into a three-dimensional movement in the modeling environment. Such three-dimensional movement captures creates the effect of allowing the user to freely navigate in the graphical model.

Figure 4A:
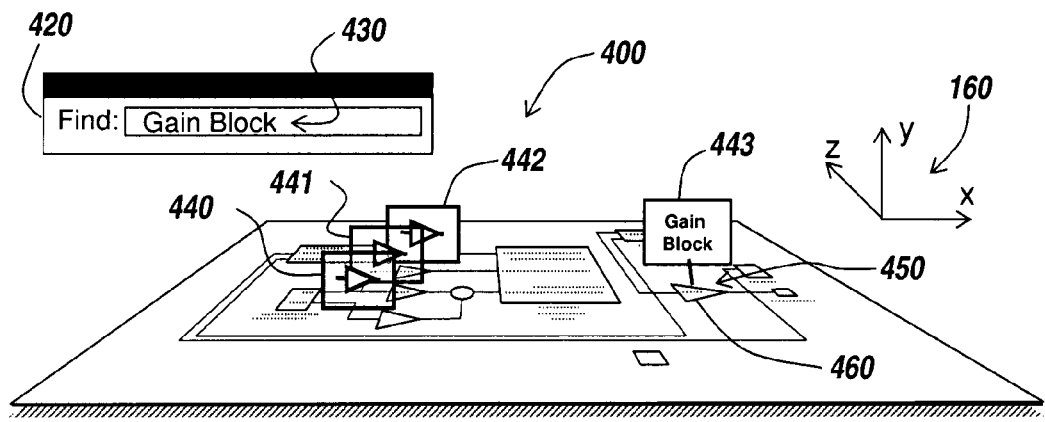
FIGS. 4A-B depict exemplary embodiments that provide a search tool that may be used to change a three-dimensional viewing perspective of a graphical model.
Figure 4B:
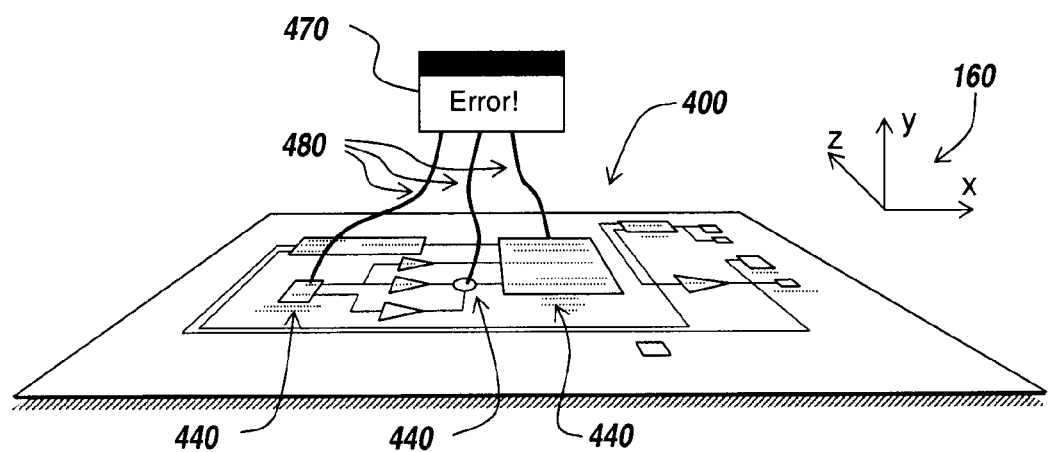

The modeling environment may also provide a mechanism for searching a graphical model rendered in a perspective view. FIGS. 4A-B depict exemplary embodiments that provide a search tool that may be used to change a three-dimensional viewing perspective of a graphical model based on one or more search parameters. For example, FIG. 4A illustrates an exemplary mechanism for searching a graphical model 400 that is depicted within a perspective view. The modeling environment may provide a user interface 420 that allows the user to enter a string of characters 430. The modeling environment may search the graphical model for elements that correspond to the entered string of characters 430. For example, as depicted in FIG. 4A, a user may enter a search string of characters 430 for a gain block in the graphical model. When the modeling environment identifies a gain block in the graphical model, graphical objects 440, 441, 442 and 443 may be rendered in the perspective view on the display. Graphical objects 440, 441, 442 and 443 may depict the corresponding gain element. Alternatively, graphical objects 440, 441, 442 and 443 may contain the string of characters 430 that the user entered as a search parameter.

Graphical objects 440-443 may be rendered as separately controllable perspective views so that graphical objects 440-443 occupy a plane that is orthogonal to the perspective view of model 400. In some instances, the perspective views for graphical objects 440-443 may be rendered to have positions other than orthogonal to the perspective view of model 400. For example, the graphical objects 440-443 may be rendered so that graphical objects 440-443 occupy a plane that is crosswise to the perspective view of model 400 without being strictly orthogonal. Perspective views for graphical objects 440-443 may be positioned so that they appear to be at the same depth (i.e. z-component) as the gain block with which they correspond in the graphical model. In some instances, a line or other indicator may be drawn from a perspective view to the corresponding element. For example, line 450 may connect a perspective view for graphical object 443 to corresponding gain block 460.

In addition to performing a search, the graphical modeling environment may also allow the user to search and replace elements in the graphical model 400. The user may enter a string of characters to search for an element and may also enter a string of characters indicating a replacement element to be inserted in the event the elements being sought are identified. In an embodiment, the search and replace operation may be provided to the user via a user interface.

The modeling environment may allow a user to identify errors in the graphical model or debug the graphical model, as depicted in FIG. 4B. To identify one or more errors in the perspective view of the graphical model, the environment may render an error message 470 that provides an indication that there are one or more errors in the graphical model. For example, the graphical modeling environment may provide a specific error message identifying a particular type of error. Alternatively, the graphical modeling environment may identify that an error occurs in a particular component of a model, or may provide a general error message that there is an error associated with the model. Lines 480 may extend between an error message 470 and elements 440 in the graphical model where the errors have been detected. The detected errors may be distinct for each of the elements 440 or may be a common error for each of the elements 440.

Exemplary Processing for Hierarchical System Views

Figure 5:
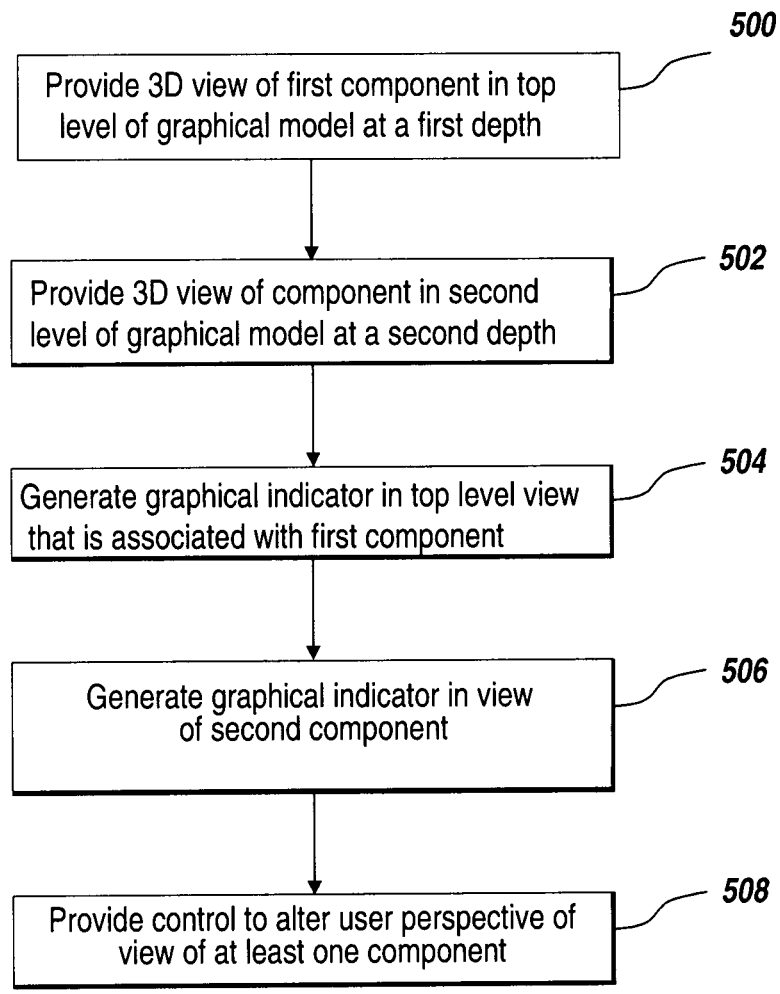
FIG. 5 depicts exemplary processing that can be used in an embodiment to associate components in a perspective view using a graphical indicator.

As discussed above, graphical indicators may be utilized to visually connect associated components in a model hierarchy displayed in a perspective view. FIG. 5 depicts exemplary processing performed by an embodiment to associate components in a perspective view using a graphical indicator. In an exemplary embodiment, the processing begins by providing a 3D perspective view that includes a first component in a top level of a graphical model. During execution of the model, the first component references a second component in the graphical model. The first component may be displayed at a first depth (step 500). A 3D perspective view of the second component is also displayed. The second component may be displayed at a second depth (step 502). A graphical indicator is then rendered in the top level view. The graphical indicator is associated with the first component (step 504). The graphical indicator is also generated in the perspective view that includes the second component (step 506). A control may also be provided that allows a user to alter the user's perspective view of at least one component in the graphical model (step 508).

Exemplary Views of Graphical Objects

In previous modeling environments there may be several viewing areas open while a user interacts with a model. As a result, the window that encompasses the viewing areas may become cluttered. This can be a frequent occurrence as the size and complexity of a model or project increases because such models/projects generally require more display area. Some previous modeling environments allow a user to minimize viewing areas with which the user does not need to interact. Minimizing viewing areas allows open viewing areas to occupy less space in the window, but minimized viewing areas typically only suggest what is contained in the viewing area (usually by displaying the name of a file that corresponds to the content contained in the viewing area). The end result of such mechanisms is that the user is forced to work in a cluttered or incomplete workspace.

Figure 6:
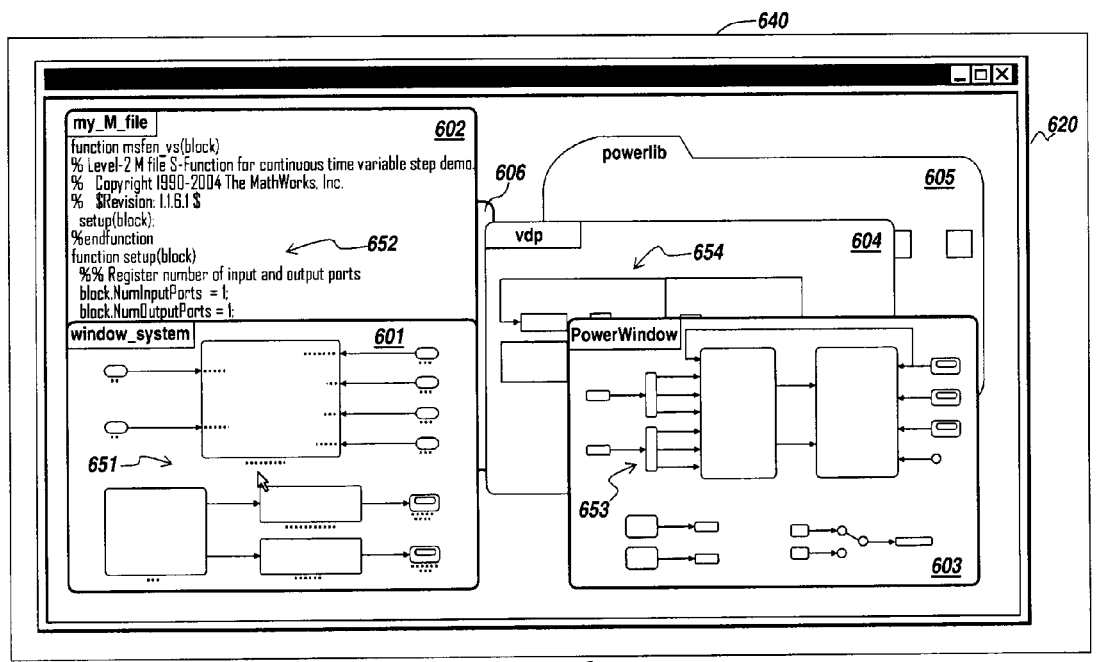
FIG. 6 (prior art) depicts prior art viewing areas rendered in a modeling environment.

FIG. 6 (prior art) depicts prior art viewing areas rendered in a modeling environment. FIG. 6 illustrates a rendering of viewing areas 601-606 in a window 620 that is part of a graphical modeling environment depicted on a display 640 (e.g., a monitor). In previous modeling environments the viewing area 601-606 may be rendered in two dimensions according to an x-component and y-component based on a coordinate system 660 having an x-axis and a y-axis. The viewing areas 601-605 depict content 651-655, respectively, that relates to various aspects of one or more models. A large portion of viewing area 606 may not be visible to a user and may prevent the user from seeing the content contained in the viewing area 606. To address this problem, the user may move the viewing areas around within the window 620 and may also change the size of the viewing areas 601-606. However, the maximum area available for rendering the viewing areas 601-606 is limited by the size (x and y dimensions) of the window 620, which in turn is limited by the size (x and y dimensions) of the display 640.

Figure 7A:
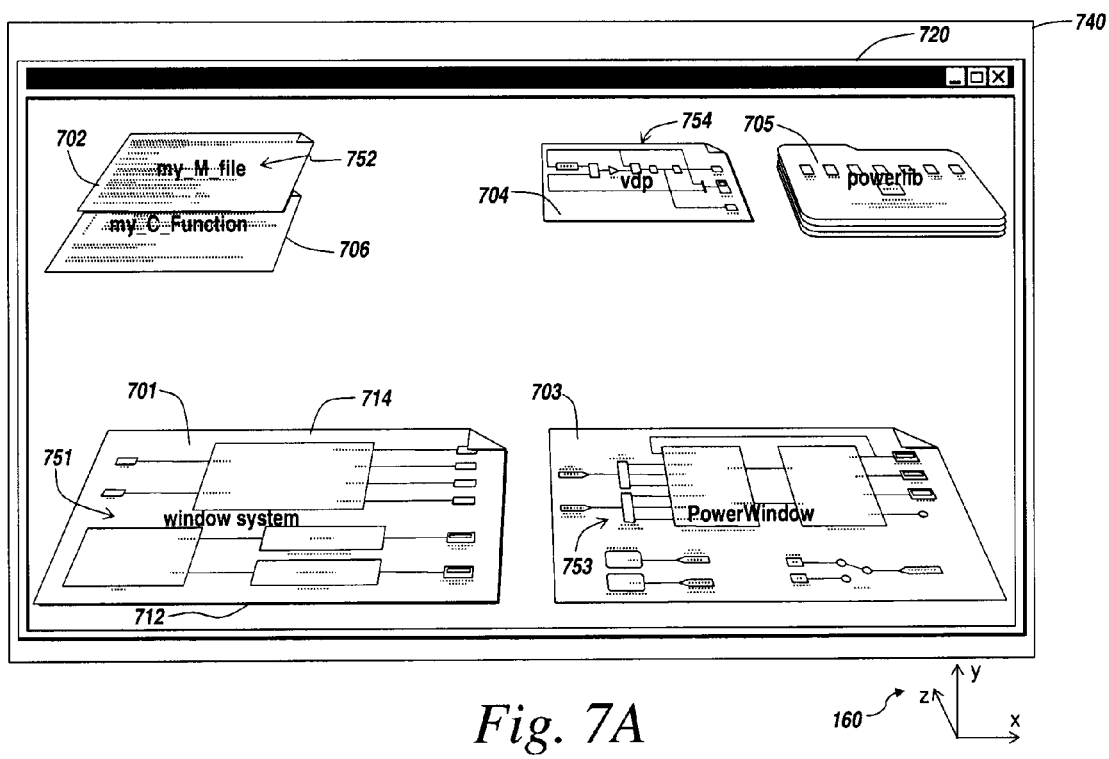
FIG. 7A depicts exemplary perspective views rendered in a modeling environment.

Techniques for providing perspective views in graphical modeling environments allow display areas to be used more efficiently than if elements in a model are displayed in two dimensions. For example, FIG. 7A depicts exemplary perspective views rendered in a modeling environment. In FIG. 7A graphical objects 701-706 are rendered in a window 720 of a modeling environment that is depicted on a display 740 (e.g., a monitor). The perspective view of graphical objects 701 may depict content 751 that is related to a portion of a model, a model, or multiple models. Similarly, graphical object 702 may depict content 752, graphical object 703 may depict content 753, graphical object 704 may depict content 754, etc. The perspective views of graphical objects 701-706 each have a generally planar configuration and are rendered using a z-axis in a three-dimensional coordinate system 160 having an x-axis, a y-axis, and a z-axis. Employing a third dimension provides the perspective views of graphical objects 701-706 so that the perspective views appear to extend into the display 740 and away from the user. For example, a first edge 712 of the perspective view of graphical object 701 appears to be closer to a user than a second edge 714 of the perspective view of graphical object 701. In this example, the perspective views of graphical objects 701-706 have an x-component, a y-component and a z-component such that the perspective views appear to be tilted away from the user.

The perspective views of graphical objects 701-706 can be positioned using all three dimensions such that a user can, for example, move the perspective views in relation to the z-axis to make the perspective views appear closer to or further away from the user. This use of a third axis allows the user to emphasize particular perspective views (e.g., perspective view of graphical object 701) by making them appear to be closer to the user and to de-emphasize perspective views (e.g., perspective view of graphical object 706) to make it appear to be further away from the user.

The content of the perspective views of graphical objects 701-706 may be discerned by the user such that the user can determine what content 751-756 is contained within each of the perspective views. As one or more of the perspective views of graphical objects 701-706 are positioned to appear to be further away from the user, the content contained within one or more of the perspective views may become less discernable to a user in a manner similar to an actual object becoming less discernable as it is moved further and further away from an observer.

In addition, the perspective views of graphical objects 701-706 can occupy one or more planes. The perspective views of graphical objects 701-706 may have the same perspective even when they do not occupy the same plane. As an example, the perspective views of graphical objects 701 and 703 occupy the same plane, while the perspective views of graphical objects 702 and 706 occupy distinct parallel planes. While the perspective views of graphical objects 702 and 706 occupy distinct planes, they still maintain the same perspective to the user.

Using the third dimension (e.g., a varying z-component such that the perspective views of graphical objects 701-706 appear to extend into the display 740) aids in alleviating congestion that may normally exist when only an x-component and a y-component (e.g., having a static, non-configurable two dimensional view) are used to render perspective views. Because the perspective views of graphical objects 701-706 appear to be tilted they require less display area than a viewing area that only has x and y components. In addition, positioning the perspective views at different depths (i.e., z-components) allows a user to maximize the number of perspective views that may be displayed without one perspective view (e.g., perspective view of graphical object 702) obstructing another perspective view (e.g., perspective view 706).

Figure 7B:
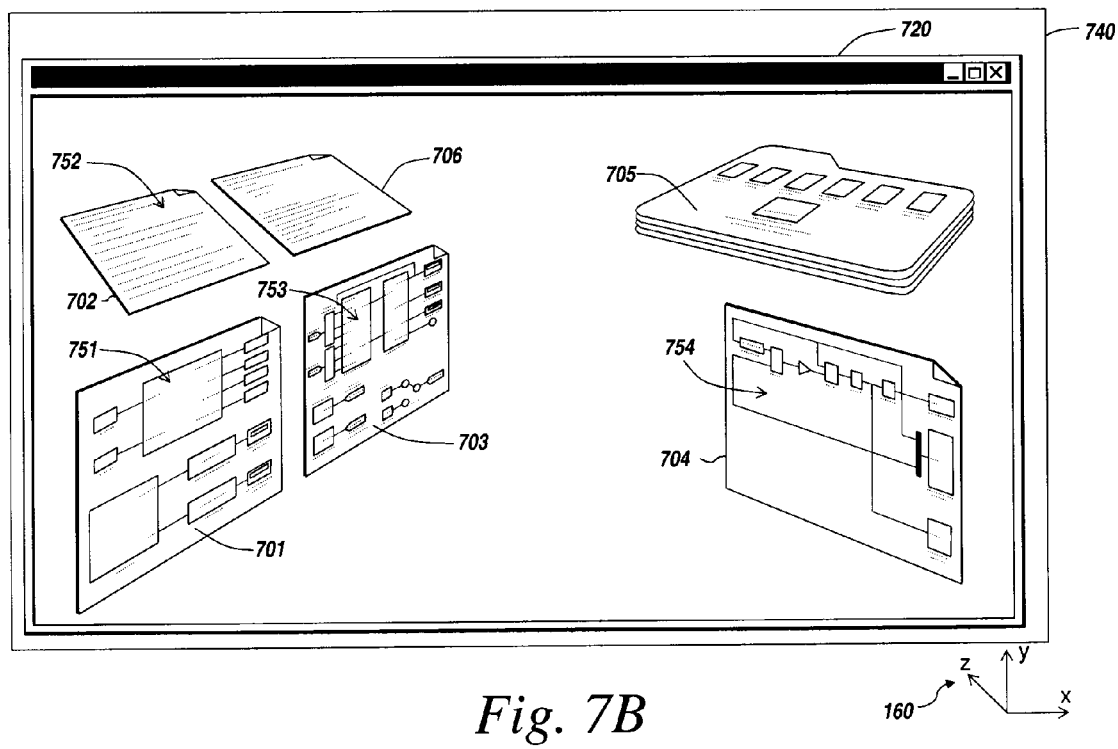
FIG. 7B depicts exemplary perspective views having varying perspectives.

The perspective views may be rendered using various perspectives and planes. For example, FIG. 7B depicts various exemplary perspective views generated by rendering the perspective views of graphical objects 701-706. For example, the perspective view of graphical object 701 may have one perspective (e.g., a first set of x, y, z components) and the perspective view of graphical object 702 may have another perspective (e.g., a second set of x, y, z components) such that the perspective view of graphical object 701 and the perspective view of graphical object 702 are in separate non-parallel planes. In this manner, the perspective view of graphical objects 701 and 702 appear to extend into the display 740 in different directions. In some embodiments, the user may be able to adjust the perspective of the perspective view of graphical objects 701-706. This may allow a user to maximize the number of unobstructed perspective views rendered in the modeling environment window 720. In addition, allowing an adjustment of the perspectives of the perspective view of graphical objects 701-706 may allow the user to orient the perspective views based on one or more aspects of the perspective views of graphical objects 701-706. In other embodiments, the modeling environment may programmatically adjust the perspective of the perspective views of graphical objects 701-706 to indicate one or more aspects relating to the perspective views.

In some embodiments, the user may navigate and edit the content (e.g., content 751) displayed in a perspective view of a graphical object (e.g., perspective view of graphical object 701) when the perspective view of graphical object is rendered. In other embodiments, the user may navigate the content of a perspective view of graphical object when the perspective view is rendered, but may be prevented from editing the content contained by the perspective view. In one embodiment, the user may need to affirmatively select the perspective view to allow the user to edit the content in the perspective view. In another embodiment, a perspective view may be rotated to indicate to allow editing.

Figure 8:
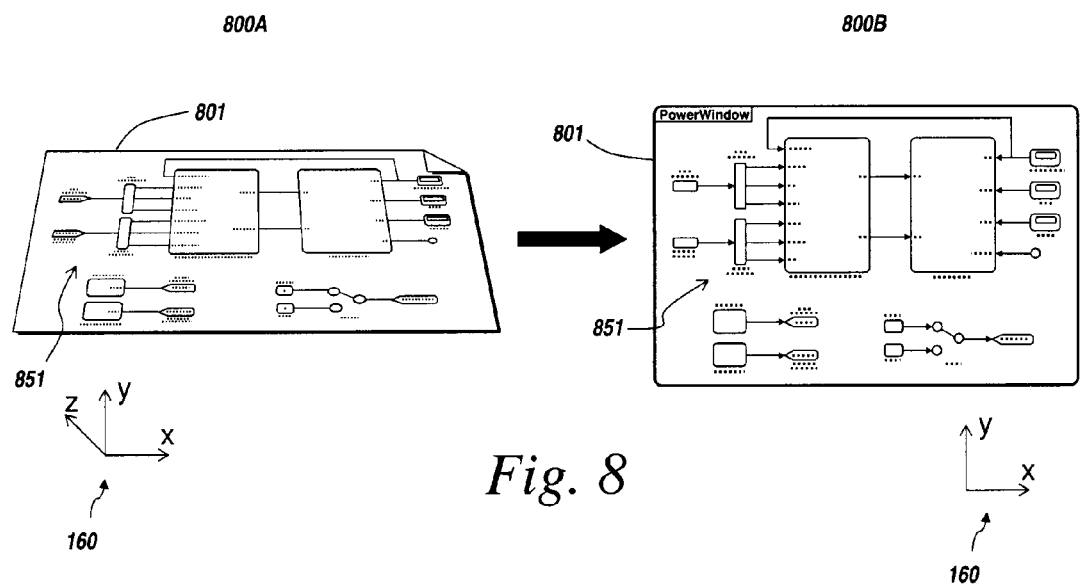
FIG. 8 depicts an exemplary implementation for rotating a perspective view.

FIG. 8 depicts an exemplary embodiment for rotating a perspective view. In this example, representation 800A of the perspective view of graphical object 801 is rendered. The user may 'navigate' the content 851 of the perspective view of graphical object 801 when the perspective view of graphical object 801 is rendered as depicted in representation 800A. The user may adjust the content using the x, y and/or z axis 160 so the content appears closer to or farther from the user as desired.

To edit the content 851 in the perspective view of graphical object 801, the user may select the perspective view of graphical object 801 using, for example, a pointing device (e.g., a mouse) or a data entry device (e.g., a keyboard). Upon selecting the perspective view of graphical object 801 for editing, the perspective view may be reoriented to an editing mode as depicted in representation 800B. When the user completes the editing of the content 851 contained in the perspective view of graphical object 801, the perspective view of graphical object 851 may again be reoriented so that the perspective view of graphical object 801 is rendered again as shown in perspective view 800A.

Figure 9:
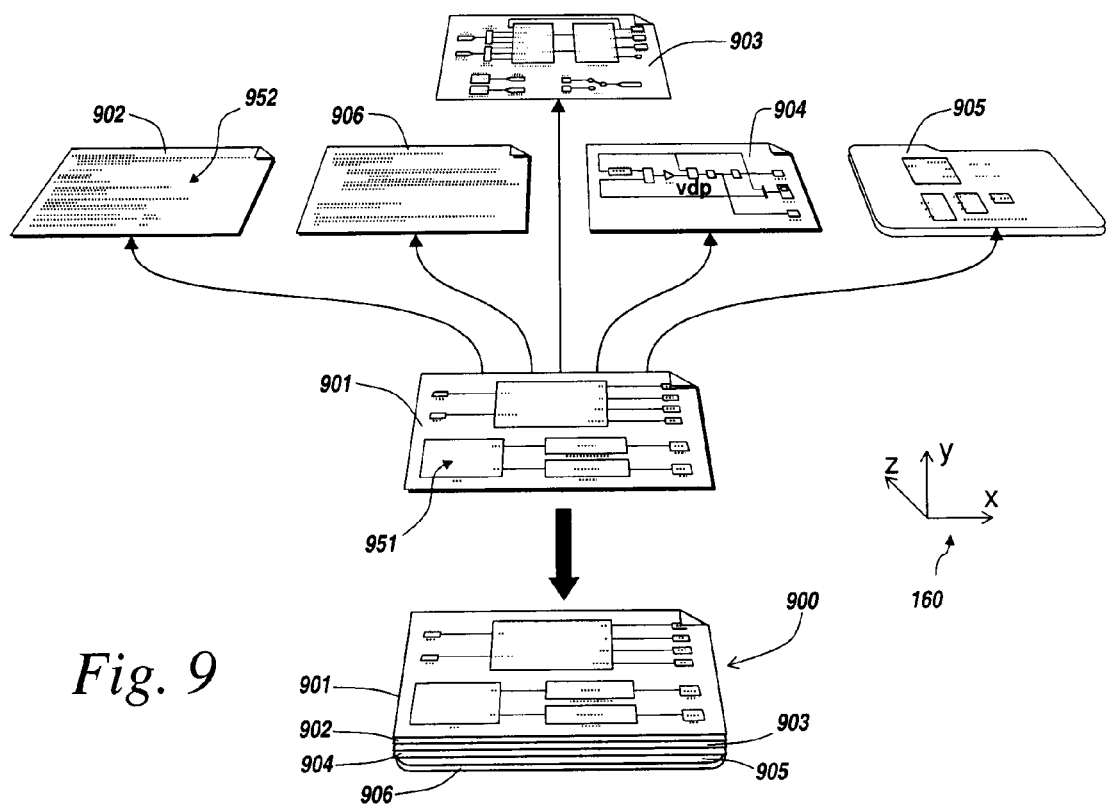
FIG. 9 depicts an exemplary stack that may be created using exemplary perspective views.

The modeling environment may also allow the perspective views to be manipulated such that the perspective views may be stacked together when the user does not wish to view the content contained by the perspective views. FIG. 9 depicts an exemplary stack 900 that may be created by exemplary perspective views. The perspective view of graphical objects 901-906 may be collected in the stack 900. The perspective view of graphical objects 901-906 may be positioned in the stack 900 arbitrarily. Alternatively, the perspective views of graphical objects 901-906 may be positioned in the stack based on the contents 951-956, respectively, contained by the perspective views of graphical objects 901-906. For example, the perspective views of graphical objects 901, 903, and 904 contain content 951, 953, and 954 that depict graphical model components, while the perspective views of graphical objects 902 and 906 contain content 952 and 956 that depict textual code associated with a graphical model. The perspective views of graphical objects 901, 903, and 904 therefore may be positioned sequentially in the stack as may the perspective views of graphical objects 902 and 906. In addition, the perspective views of graphical objects 901-906 collected in the stack 900 may be arranged by other characteristics associated with the perspective views. For example, the perspective views of graphical objects 901-906 may be positioned according to a file name, a file size, a file type, a file location, a date of creation, a date of modification, etc., that is associated with the perspective views of graphical objects 901-906. Additionally, the stack 900 may include graphical objects 901-906 of varying graphical sizes.

The modeling environment may allow the user to manipulate a stack so that the content of the perspective views of graphical objects may be observed by the user. FIGS. 10A-C depict exemplary manipulations of the stack created in FIG. 9. In FIG. 10A, stack 1000 may include the perspective views of graphical objects 1001-1006. The user may manipulate stack 1000 such that the perspective views of graphical objects 1001-1006 are spread out, while still maintaining the relative position in the stack of each of the perspective views of graphical objects 1001-1006 in stack 1000. Stack 1000 may be manipulated using a number of methods. For example, stack 1000 may be manipulated by selecting an individual perspective view 1001-1006 and re-orienting the selected view along the x, y and z axes 160. By spreading stack 1000 out, the user can observe the content of the perspective views. This ability to manipulate the stack of perspective views allows a user to determine whether one of the perspective views included in stack 1000 should be removed from the stack 1000. After observing the content of the perspective views of graphical objects 1001-1006, stack 1000 may be returned to a compressed form. When the perspective views of graphical objects 1001-1006 included in stack 1000 are spread out, the user's perspective of the graphical objects may change as depicted in FIG. 10A. Alternatively, the perspective views of graphical objects 1001-1006 may preserve their perspective in a similar manner to a physical deck of cards spread out on a table.

In FIG. 10B, stack 1000 can be manipulated so the user can browse stack 1000 to observe the content contained in the perspective views of graphical objects. In one embodiment, as the user moves the pointing device over stack 1000, one or more of the perspective views of graphical objects may be rendered (such as the depicted perspective view of graphical object 1001) so that the content of the one or more perspective views may be observed by the user while maintaining the relative position of the perspective views in stack 1000.

In FIG. 10C, stack 1000 can be manipulated so the user can pull out one or more of the perspective views of graphical objects 1001-1006 included in the stack while maintaining the relative position of the perspective views of graphical objects 1001-1006 in stack 1000. For example, the user may wish to observe the content of the perspective view of graphical object 1003. To pull out the perspective view of graphical object 1003, the user may, for example, position the pointing device on the perspective view of graphical object 1003 in stack 1000 and select and drag the perspective view of graphical object 1003 away from stack 1000.

Exemplary Processing for Graphical Object Views

Figure 11:
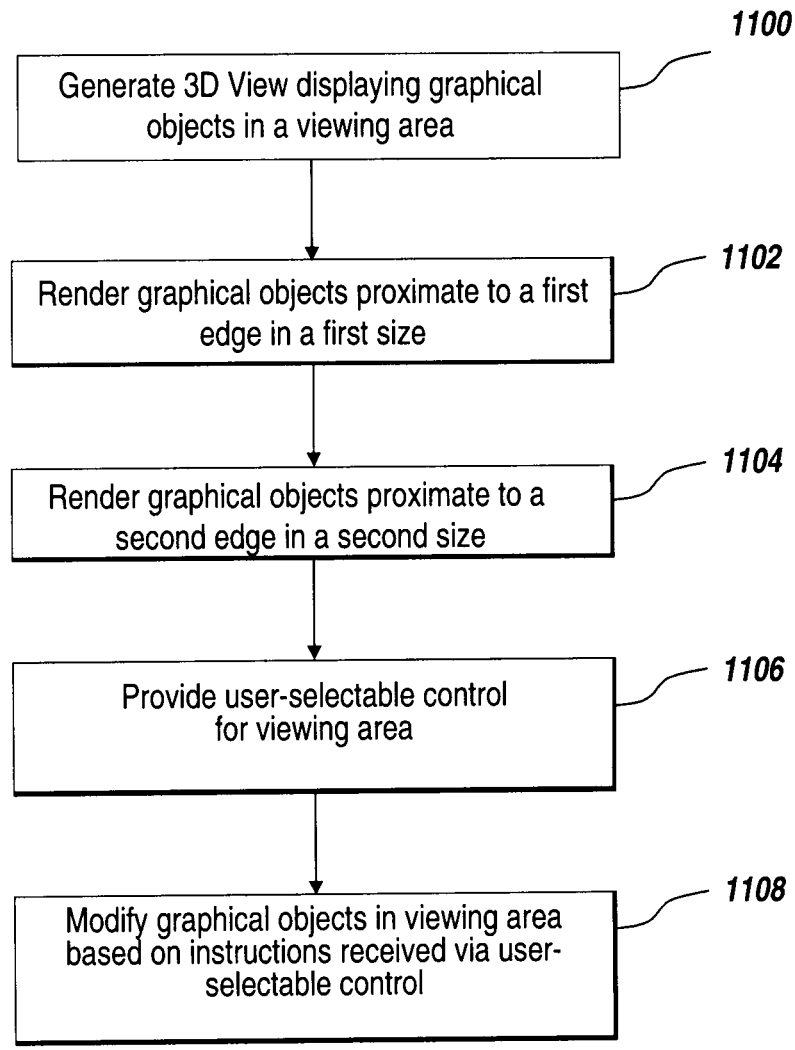
FIG. 11 depicts exemplary processing that can be used in an embodiment to display graphical objects.

FIG. 11 depicts exemplary processing by an embodiment to display graphical objects. In the exemplary embodiment, the processing begins by generating a 3D View displaying graphical objects in a viewing area (step 1100). The processing renders graphical objects proximate to a first edge in a first size (step 1102). The processing also renders graphical objects proximate to a second edge in a second size (step 1104). The rendering of the objects in different sizes serves to emphasize or de-emphasize the graphical objects in the viewing area. A user-selectable control is provided for the viewing area (step 1106). The user-selectable control provides fine-grained control over the display of individual graphical objects in the viewing area in contrast to previous graphical object display techniques. The graphical objects in the viewing area may be individually or collectively modified based on instructions received via the user-selectable control (step 1108).

Exemplary Modeling Environment

Figure 12:
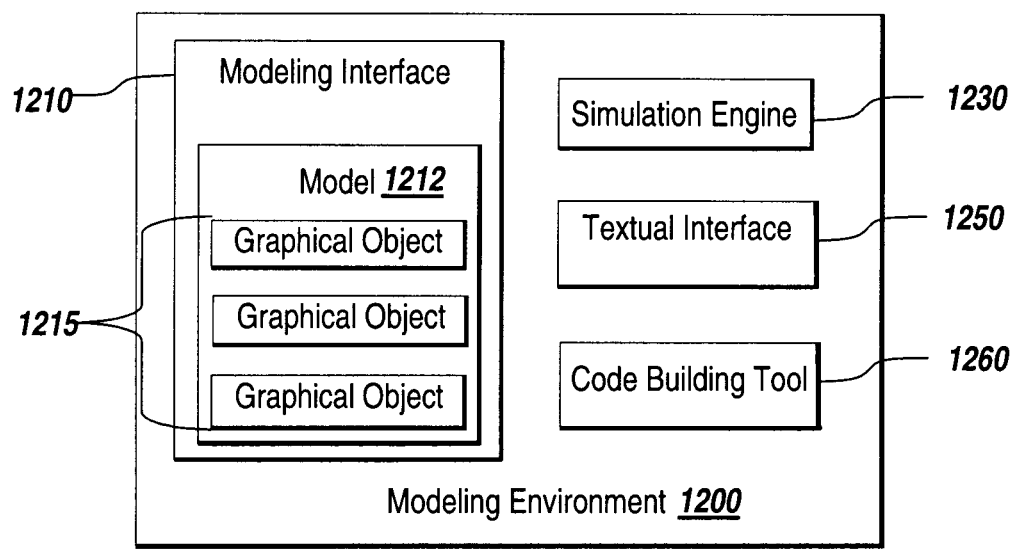
FIG. 12 depicts a block diagram of an exemplary modeling environment for rendering perspective views.

FIG. 12 depicts a block diagram of an exemplary modeling environment for rendering perspective views. FIG. 12 is a high-level block diagram depicting a modeling environment 1200 suitable for an embodiment for performing actions related to models such as developing, simulating, and analyzing models. For example, actions may be performed on models of dynamic systems. Modeling environment 1200 may include graphical user interface (GUI) 1210, simulation engine 1230, textual interface 1250, and code building tool 1260.

GUI 1210 can be rendered on a display to provide a window and one or more perspective views of graphical objects. Modeling environment 1200 allows a user to develop, view, debug, etc. models in GUI 1210. Using GUI 1210, a user can create graphical model 1212 that includes, for example, one or more graphical objects 1215. The one or more graphical objects 1215 may be, for example, an element, a subsystem, or any other graphical representation for modeling a system, such as a dynamic system. The user may use graphical objects supplied by the modeling environment or user-supplied graphical objects to develop a model.

Textual interface 1250 may allow a user to develop a user-defined element with a sequence of commands in a textual language. Textual interface 1250 can also facilitate debugging and/or profiling of a model. Alternatively, implementations of graphical modeling environment 1200 may include a separate debugger and profiler.

Simulation engine 1230 may communicate with GUI 1210. Simulation engine 1230 can receive a model such as, for example, a block diagram model, a state diagram model, a UML model, a text-based model (e.g., a sequence of commands), etc., that is generated using GUI 1210. Simulation engine 1230 can convert the model generated using GUI 1210 to an executable form after first linking the model. The executable form is referred to as a compiled model. Simulation engine 1230 can repetitively execute the compiled model e.g., via successive time steps from a simulation start time to a stop time specified by the user or until the simulation is interrupted. Alternatively, Simulation engine 1230 may enable interpretive simulation of the model.

Code building tool 1260 can be used to generate code, such as source code, object code, a compiled executable or library for forming an executable of a model provided by GUI 1210. Code building tool 1260 can also be used to generate a hardware description language representation of the model. Code building tool 1260 uses code for portions of a model to generate executable code, instructions, etc. in a programming language such as Java, JavaScript, C or C++ or a hardware description language (HDL) such as Verilog or VHDL. To generate code, code building tool 1260 can convert a source model language representation of a model to a target language. Code building tool 1260 may comprise an extended version of a code building tool such as Real-Time Workshop® software from The MathWorks, Inc. of Natick, Mass. or any portion thereof, or may be substantially any software component for generating executable code, instructions, etc., in a programming language such as Java or C or in a hardware description language such as Verilog or VHDL.

Code building tool 1260 can generate source code for the execution of a model that is provided by modeling interface 1210, and can compile the source code into object code and build an executable program, library or substantially any other form of executable instructions. The code may be designed to run on any processor, microprocessor, dual-core processor, multi-core processor, cluster of processors, operating system, computational hardware device, component of a computational hardware device, etc. In one embodiment, the code may comprise embedded code targeted to run on an embedded system. Additionally, the code can be customized to run on a specific target hardware platform. For example, the code generated may include fixed-point code to run a fixed-point processor or code can be generated to emulate fixed-point behavior on a floating-point processor.

The components of modeling environment 1200 may be provided on the same computing device, or alternatively, may be coupled to each other via a communication network.

Exemplary Computing Architecture

Figure 13:
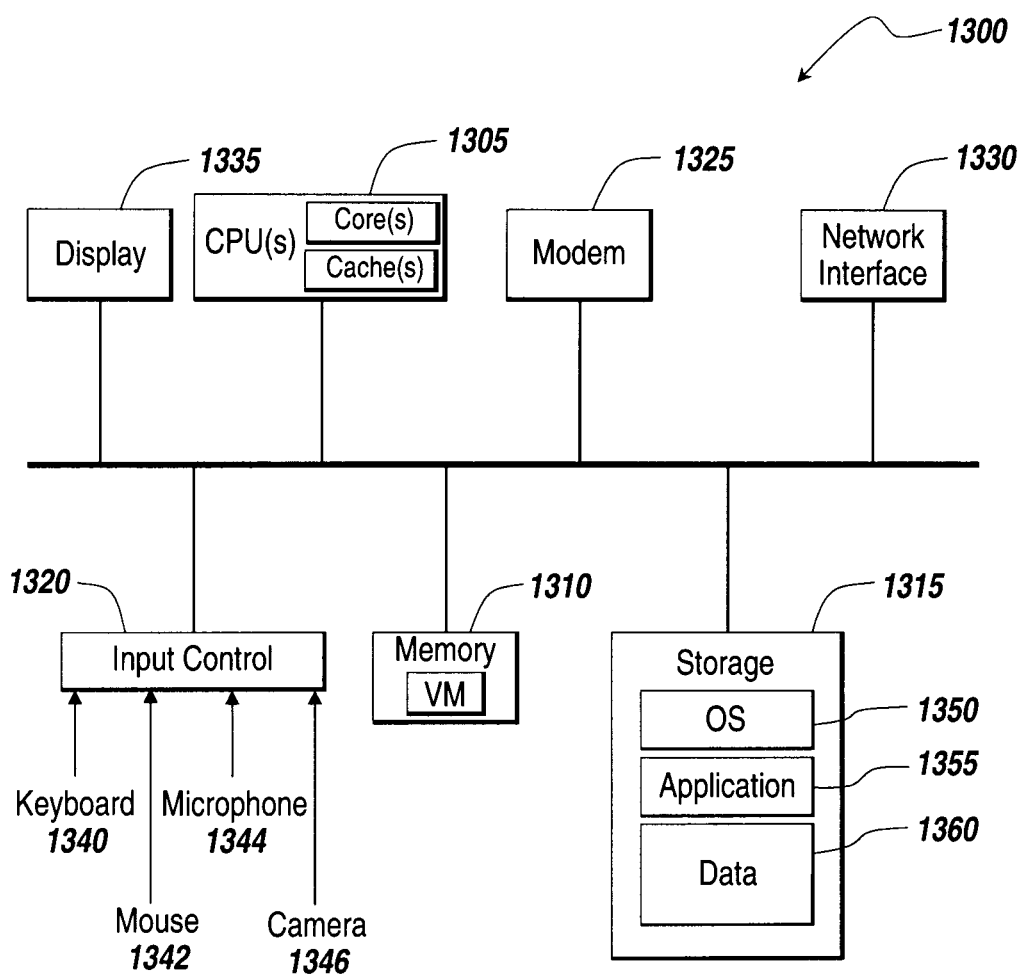
FIG. 13 depicts a block diagram of an exemplary computing device that may used to implement the modeling environment of FIG. 12.

FIG. 13 depicts a block diagram of an exemplary computing device 1300 that may be used to implement the modeling environment of FIG. 12. Computing device 1300 is intended to be illustrative and not limiting of the present invention. Computing device 1300 may take many forms, including but not limited to a personal computer, workstation, server, network computer, quantum computer, optical computer, bio computer, Internet appliance, mobile device, a pager, a tablet computer, and the like.

Computing device 1300 may be electronic and may include Central Processing Unit (CPU) 1305, memory 1310, storage 1315, input control 1320, modem 1325, network interface 1330, display 1335, etc. CPU 1305 may control each component of computing device 1300 to provide modeling environment 1200, simulation engine 1230, textual interface 1250, and/or code building tool 1260. Memory 1310 temporarily stores instructions and data and provides them to CPU 1305 so that CPU 1305 operates the computing device 1300. CPU may also run modeling environment 1210, simulation engine 1230, textual interface 1250, and/or code building tool 1260, based on the stored instructions.

Optionally, computing device 1300 may include multiple CPUs for executing software loaded in memory 1310, and other programs for controlling system hardware. Each of the CPUs can be a single or a multiple core processor. The code loaded in memory 1310 may run in a virtualized environment, such as in a Virtual Machine (VM). Multiple VMs may be resident on a single processor. Also, part of the application could be run in hardware, for example, by configuring a field programmable gate array (FPGA), using an application specific instruction set processor (ASIP) or creating an application specific integrated circuit (ASIC). Further, part of the applications may be run on analog electronic devices or other resources may be used to run part of the application, such as graphics processing units (GPUs) or dedicated hardware such as Fast Fourier Transform (FFT) processing blocks.

Storage 1315 may contain software tools for applications. Storage 1315 can include code for the operating system (OS) 1350 of the device 1300, code for at least one application 1355 executed by the OS 1350 including the applications for the modeling environment 1210, simulation engine 1230, textual interface 1250, and code building tool 1260. Storage 1315 may also hold data 1360 generated from the modeling environment 1210, simulation engine 1230, textual interface 1250, and code building tool 1260. Those of ordinary skill in the art will appreciate that parts of the applications can be stored in the CPU cache or memory 1310 as well, or they can be stored on the network described below with reference to FIG. 14.

Input control 1320 may interface with keyboard 1340, mouse 1342, microphone 1344, camera 1346, such as a web camera, or other input devices such as a 3D mouse, space mouse, multipoint touchpad, accelerometer-based device, gyroscope-based device, etc. Computing device 1300 may receive, through input control 1320, input data, such as the input data for developing a model. Computing device 1300 may display on display 1335 user interfaces for displaying the data generated from modeling environment 1200, simulation engine 1230, textual interface 1250, and code building tool 1260.

Exemplary Network Environment

Figure 14:
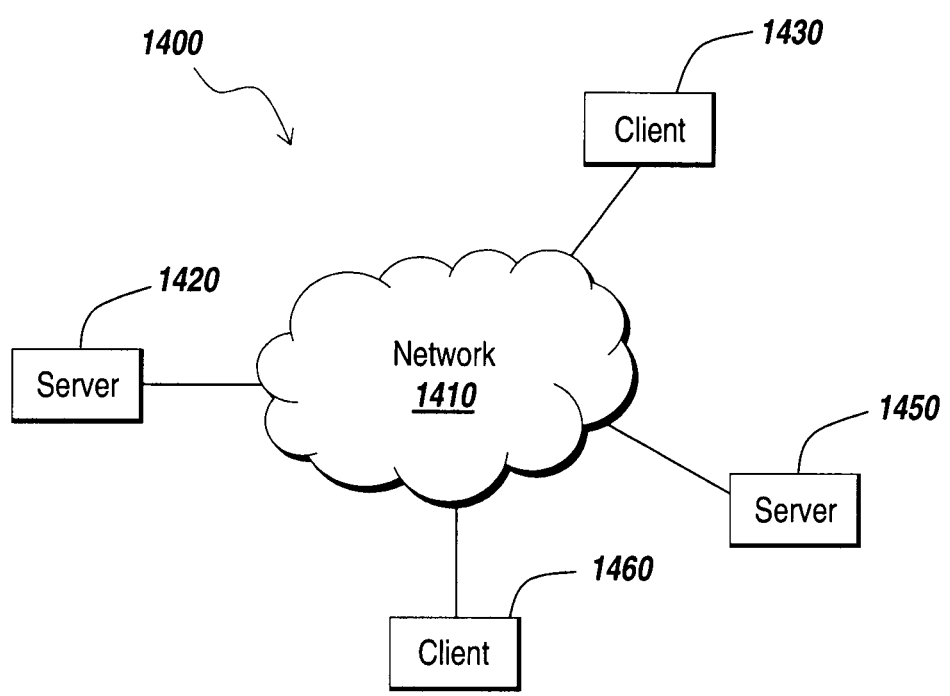
FIG. 14 depicts an exemplary distributed system suitable for practicing a distributed embodiment.

FIG. 14 depicts an exemplary distributed system suitable for practicing a distributed embodiment. In, FIG. 14 an exemplary network environment 1400 may include one or more servers 1420 and 1450 communicating with clients 1430 and 1440 via a network 1410. Network interface 1330 and modem 1325 of computing device 1300 enable the servers 1420 and 1450 to communicate with the clients 1430 and 1440 through the network 1410. Network 1410 may be the Internet, intranet, LAN (Local Area Network), WAN (Wide Area Network), MAN (Metropolitan Area Network), wireless network (e.g., using IEEE 802.13 and Bluetooth), etc. In addition network 1410 may use middleware, such as CORBA (Common Object Request Broker Architecture) or DCOM (Distributed Component Object Model) to allow a computer on the network to communicate directly with another computer or device that is connected to the network. The communication facilities can support the distributed implementations of the present invention and may utilize Remote Method Invocation (RMI), Remote Procedure Calls (RCP), Simple Object Access Protocol (SOAP), etc.

In network environment 1400, servers 1420 and 1450 may provide clients 1430 and 1440 with software components or products under a particular condition, such as a license agreement. The software components or products may include those for providing modeling environment 1200 and/or implementations of code for select elements. The software components or products may also include those for the simulation engine 1230, textual interface 1250, and code building tool 1260 coupled to modeling environment 1200. In one example, client 1440 may perform the modeling of a dynamic system using a software component provided by server 1420 and send server 1420 the model for simulation. Server 1420 may return the simulation results to client 1440 and client 1440 may subsequently display the simulation data to the user with the information on the simulation data.

Additional Alternative Embodiments

The present invention may be provided as one or more computer-readable programs embodied on or in one or more mediums. The mediums may be a floppy disk, a hard disk, a compact disc, a digital versatile disc, a flash memory card, a PROM, an MRAM, a RAM, a ROM, or a magnetic tape. In general, the computer-readable programs may be implemented in any programming language. Some examples of languages that can be used include MATLAB, FORTRAN, C, C++, C#, Python, FLASH, JavaScript, or Java. The software programs may be stored on, or in, one or more mediums as object code. Hardware acceleration may be used and all or a portion of the code may run on a FPGA, an Application Specific Integrated Processor (ASIP), or an Application Specific Integrated Circuit (ASIC). The code may run in a virtualized environment such as in a virtual machine. Multiple virtual machines running the code may be resident on a single processor.

CONCLUSION

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

The foregoing description of example embodiments of the invention provides illustration and description, but is not intended to be exhaustive or to limit the invention to the precise form disclosed. Modifications and variations are possible in light of the above teachings or may be acquired from practice of the invention. For example, while a series of acts has been described with regard to FIGS. 5 and 11, the order of the acts may be modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. Devices and/or components may be added and/or removed from the implementations of FIGS. 1A-4B and 7A-10C depending on specific deployments and/or applications. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, wetware, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

The scope of the invention is defined by the claims and their equivalents.

We claim:

1. One or more computer readable non-transitory media storing computer-executable instructions that, when executed on a processor, display a graphical model in three dimensions, the computer-executable instructions including instructions for:
receiving data for developing an executable graphical model representing a real-world physical system, where:
the graphical model includes a plurality of levels arranged in a hierarchy that includes a top level and a second level lower in hierarchy than the top level,
the top level of the hierarchy comprising a first plurality of components that includes a first component of the executable graphical model,
the first component representing a real-world physical component,
the first component including one or more sub-components provided at the second level of the hierarchy that is lower in hierarchy than the top level, and
the second level of the hierarchy comprising a second plurality of components that includes a first sub-component of the one or more sub-components;
displaying a three-dimensional (3D) view of the graphical model, the instructions for displaying the 3D view including:
providing a first view of the top level of the graphical model at a first common visual depth, wherein the first view displays the top level on a first plane at the first common visual depth;
providing a second view at a second common visual depth, the second view including the first sub-component, wherein the second view displays the second level on a second plane displayed at the second common visual depth;
generating a first graphical indicator in the first view, the first graphical indicator associated with the first component; and
generating a second graphical indicator in the second view, where the second graphical indicator:
matches the first graphical indicator,
is associated with the first sub-component, and
represents a hierarchical link between an execution of the first component and an execution of the first sub-component during the execution of the executable graphical model; and
providing a control that alters a viewing perspective that includes the first component, the first sub-component, or another component or sub-component, the another component or sub-component included in the graphical model, wherein altering the viewing perspective causes the first sub-component to become more discernible by at least one of appearing closer to a viewer or rotating the first sub-component on an axis such that the first sub-component faces the viewer,
wherein the real world physical system includes an electrical circuit; and
the first component is an electrical circuit component;
wherein the first component is related to the first sub-component by a hierarchical relationship that includes at least one of a functional relationship or a function call relationship, and
altering the viewing perspective brings the hierarchical relationship into focus.

2. The non-transitory media of claim 1 wherein the graphical indicator is a color or shading associated with the first component and second component.

3. The non-transitory media of claim 1 wherein the non-transitory media holds further instructions for:
displaying a visual connection between the first component and the first sub-component.

4. The non-transitory media of claim 1 wherein the altering of the user perspective tilts the viewing perspective of the at least one component in the graphical model.

5. The non-transitory media of claim 1 wherein the view at the second depth includes a component that references a third component, the instructions further:
displaying in the second view at least one component representing the component that references the third component;
displaying in the second view a third graphical indicator associated with the at least one component that references the third component;
providing a third view at a third depth, the third view including the third component;
and displaying in the third view the third graphical indicator.

6. The non-transitory media of claim 1 wherein the first sub-component is a model reference.

7. The non-transitory media of claim 1 wherein the first sub-component is at least one of a subsystem, superblock, non-virtual subsystem, virtual subsystem, a configurable subsystem, a masked subsystem, a state diagram, C-based code, MATLAB-based code or embedded MATLAB-based code.

8. The non-transitory media of claim 1 wherein the control is a focus tool selectable by a user to change a viewing perspective of the 3D view.

9. The non-transitory media of claim 8 wherein the focus tool may be used to emphasize or de-emphasize a portion of the graphical model.

10. The non-transitory media of claim 9 wherein the focus tool may be used to increase or decrease a size of a view or component in the graphical model.

11. The non-transitory media of claim 1 wherein the top level of the graphical model includes at least two components respectively being formed of at least two sub-components, the at least two sub-components located at a different hierarchical level from the at least two components, unique indicators being associated with each of the at least two sub-components.

12. The non-transitory media of claim 1 wherein the 3D view represents one of a structural, functional or dependency hierarchy in the graphical model.

13. The non-transitory media of claim 1 wherein the graphical model is a block diagram model.

14. The non-transitory media of claim 1 wherein the instructions further comprise: receiving a search parameter;
performing a search of the graphical model using the search parameter; and
displaying an indicator in the 3D view of the graphical model as a result of the search, the indicator associated with the first component, the first sub-component or another component.

15. The non-transitory media of claim 1, wherein the instructions further comprise:
identifying an error in the graphical model; and
displaying an error message in the 3D view of the graphical model.

16. The non-transitory media of claim 15 wherein the error message is associated with at least one specific component in the 3D view of the graphical model.

17. A computer-implemented system comprising:
one or more processors for:
receiving data for developing an executable graphical model representing a real-world physical system, where:
the graphical model includes a plurality of levels arranged in a hierarchy that includes a top level and a second level lower in hierarchy than the top level,
the top level of the hierarchy comprising a first plurality of components that includes a first component of the executable graphical model,
the first component representing a real-world physical component,
the first component including one or more sub-components provided at the second level of the hierarchy that is lower in hierarchy than the top level, and
the second level of the hierarchy comprising a second plurality of components that includes a first sub-component of the one or more sub-components;
displaying a three-dimensional (3D) view of the graphical model, the instructions for displaying the 3D view including:
providing a first view of the top level of the graphical model at a first common visual depth, wherein the first view displays the top level on a first plane at the first common visual depth;
providing a second view at a second common visual depth, the second view including the first sub-component, wherein the second view displays the second level on a second plane displayed at the second common visual depth;
generating a first graphical indicator in the first view, the first graphical indicator associated with the first component; and
generating a second graphical indicator in the second view, where the second graphical indicator:
matches the first graphical indicator,
is associated with the first sub-component, and
represents a hierarchical link between an execution of the first component and an execution of the first sub-component during the execution of the executable graphical model; and
providing a control that alters a viewing perspective that includes the first component, the first sub-component, or another component or sub-component, the another component or sub-component included in the graphical model, wherein altering the viewing perspective causes the first sub-component to become more discernible by at least one of appearing closer to a viewer or rotating the first sub-component on an axis such that the first sub-component faces the viewer, wherein the real world physical system includes an electrical circuit; and the first component is an electrical circuit component;

wherein the first component is related to the first sub-component by a hierarchical relationship that includes at least one of a functional relationship or a function call relationship, and altering the viewing perspective brings the hierarchical relationship into focus.

18. One or more computer-readable non-transitory media storing computer-executable instructions that, when executed on a processor, display a graphical model in three dimensions, the computer-executable instructions including instructions for:

receiving data for developing an executable graphical model wherein the graphical model includes a plurality of graphical model components;

displaying a three-dimensional (3D) view of the graphical model, wherein the instructions for displaying the 3D view comprise instructions for:

displaying a first plurality of graphical objects on a first plane, wherein the first plurality of graphical objects correspond to a first level in a hierarchy of the graphical model;

displaying a second plurality of graphical objects on a second plane, wherein the second plurality of graphical objects correspond to a second level in the hierarchy of the graphical model, the second level being lower than the first level; and wherein:

the first plurality of graphical objects and the second plurality of graphical objects include representations of the plurality of graphical model components; and providing a control that alters a viewing perspective that includes the first plurality of graphical objects and the second plurality of graphical objects, wherein altering the viewing perspective causes one or more of the second plurality of graphical objects to become more discernible by at least one of appearing closer to a viewer or rotating the first sub-component on an axis such that the first sub-component faces the viewer, wherein the real world physical system includes an electrical circuit; and the first component is an electrical circuit component;

wherein the first component is related to the first sub-component by a hierarchical relationship that includes at least one of a functional relationship or a function call relationship, and altering the viewing perspective brings the hierarchical relationship into focus.

19. The one or more computer-readable non-transitory media of claim 18, wherein each of the plurality of graphical model components represented in the second plurality of graphical objects is referenced by at least one of the plurality of graphical model components represented in the first plurality of graphical objects.

20. The one or more computer-readable non-transitory media of claim 18, wherein each of the first plurality of graphical objects and the second plurality of graphical objects represent at least one of a graphical model component of the plurality of graphical model components, a textual specification corresponding to the graphical model, and a state in a state diagram model corresponding to the graphical model.

21. The one or more computer-readable non-transitory media of claim 18, wherein:

a first graphical model component of the plurality of graphical model components is represented by a first graphical object of the first plurality of graphical objects;

a second graphical model component of the plurality of graphical model components is represented by a second graphical object of the second plurality of graphical objects;

the first graphical model component references the second graphical model component; and the computer-executable instructions further include instructions for:

creating a visual association between the first graphical object and the second graphical object.

22. The one or more computer-readable non-transitory media of claim 21, wherein the visual association includes applying a same color to the first graphical object and the second graphical object or drawing a line connecting the first graphical object and the second graphical object.

23. The one or more computer-readable non-transitory media of claim 18, wherein the computer-executable instructions further include instructions for at least one of:

displaying a first flat surface to display the first plane, and displaying a second flat surface to display the second plane.

24. The one or more computer-readable non-transitory media of claim 18, wherein the hierarchy includes a graphical hierarchy in which a first model component belongs to the first level and a second model component belongs to the second level when the second model component is a sub-component of the first model component.

25. The one or more computer-readable non-transitory media of claim 18, wherein the hierarchy includes a functional hierarchy in which a first model component belongs to the first level and a second model component belongs to the second level when the second model component relates to a function call in the first model component.

26. The one or more computer-readable non-transitory media of claim 18, wherein the hierarchy includes a functional hierarchy in which a first model component belongs to the first level and a second model component belongs to a third level when the second model component relates to a function call that is twice removed from the first model component.

27. The one or more computer-readable non-transitory media of claim 18, wherein the second plane is parallel to the first plane.

28. The one or more computer-readable non-transitory media of claim 18, wherein altering the viewing perspective causes the second plane to face a viewer of the 3D view.

29. The one or more computer readable non-transitory media of claim 1, wherein the electrical circuit component includes one or more of a gain block, a multiplexer, a switch, a signal selector, and a bus selector.

30. The one or more computer readable non-transitory media of claim 1, wherein the first component is related to the first subcomponent by a hierarchical relationship that includes a structural relationship.

31. The one or more computer readable non-transitory media of claim 1, wherein the first component is related to the first subcomponent by a hierarchical relationship that includes a content relationship.

* * * * *